US009947883B2

United States Patent
Choi et al.

(10) Patent No.: US 9,947,883 B2
(45) Date of Patent: Apr. 17, 2018

(54) FOLDABLE DISPLAY APPARATUS

(71) Applicant: Samsung Display Co., Ltd., Yongin-si, Gyeonggi-do (KR)

(72) Inventors: Jinhwan Choi, Yongin-si (KR); Taean Seo, Yongin-si (KR); Taewoong Kim, Yongin-si (KR); Boik Park, Yongin-si (KR); Juchan Park, Yongin-si (KR); Younggug Seol, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/295,713

(22) Filed: Oct. 17, 2016

(65) Prior Publication Data

US 2017/0141173 A1    May 18, 2017

(30) Foreign Application Priority Data

Nov. 13, 2015    (KR) .................. 10-2015-0159700

(51) Int. Cl.
*H05K 5/00*    (2006.01)
*H01L 51/00*   (2006.01)
*G06F 1/16*    (2006.01)

(52) U.S. Cl.
CPC ........ *H01L 51/0097* (2013.01); *G06F 1/1616* (2013.01); *G06F 1/1641* (2013.01); *G06F 1/1647* (2013.01); *G06F 1/1652* (2013.01); *Y02E 10/549* (2013.01)

(58) Field of Classification Search
CPC ............ H01L 27/3267; H01L 51/0097; H01L 2251/5338; G06F 1/1616; G06F 1/1641; G06F 1/1647; G06F 1/1652
See application file for complete search history.

(56) References Cited

U.S. PATENT DOCUMENTS

| 8,804,317 B2 * | 8/2014 | Watanabe ........... G02F 1/13336 345/1.1 |
| 2006/0077544 A1 * | 4/2006 | Stark ................... G02F 1/13336 359/448 |
| 2010/0201603 A1 | 8/2010 | Kee et al. |
| 2010/0277665 A1 * | 11/2010 | Kuo ..................... G02F 1/13336 349/58 |
| 2015/0146349 A1 | 5/2015 | Choi et al. |

FOREIGN PATENT DOCUMENTS

| KR | 10-1999-0038723 A | 6/1999 |
| KR | 10-2010-0092220 A | 8/2010 |
| KR | 10-2014-0103025 A | 8/2014 |
| KR | 10-2015-0060161 A | 6/2015 |
| KR | 10-2015-0064618 A | 11/2015 |
| WO | WO 2014/126403 A1 | 8/2014 |

* cited by examiner

*Primary Examiner* — James Wu
*Assistant Examiner* — Hung Dang
(74) *Attorney, Agent, or Firm* — Lewis Roca Rothgerber Christie LLP

(57) ABSTRACT

A foldable display apparatus includes: a first flexible panel and a second flexible panel, the first and second flexible panels being separate from each other; a first case supporting the first flexible panel and a second case supporting the second flexible panel; and a link member foldably connecting the first and second cases, and adjacent boundary regions of the first and second flexible panels are curved.

15 Claims, 5 Drawing Sheets

FOLDABLE DISPLAY APPARATUS

CROSS-REFERENCE TO RELATED APPLICATION

This application claims priority to and the benefit of Korean Patent Application No. 10-2015-0159700, filed on Nov. 13, 2015 in the Korean Intellectual Property Office, the disclosure of which is incorporated herein in its entirety by reference.

BACKGROUND

1. Field

One or more exemplary embodiments relate to a foldable display apparatus that may be folded and opened.

2. Description of the Related Art

A display panel, for example, an organic light-emitting display apparatus, may be flexible, and accordingly, may be formed as a foldable display apparatus for convenience of portability.

However, even though the display panel is flexible, when the display panel is repeatedly opened and folded over time, stress may be repeatedly applied to a folding portion of the display panel and may cause a protection film to exfoliate or deform.

SUMMARY

One or more exemplary embodiments include foldable display apparatuses that address the above-described condition.

Additional aspects will be set forth, in part, in the description which follows and, in part, will be apparent from the description or may be learned by practice of the presented embodiments.

According to one or more exemplary embodiments, a foldable display apparatus includes: a first flexible panel and a second flexible panel, the first and second flexible panels being separate from each other; a first case supporting the first flexible panel and a second case supporting the second flexible panel; and a link member foldably connecting the first and second cases. Adjacent boundary regions of the first and second flexible panels are curved.

Each of the first and second flexible panels may include a display region on which an image is displayed and a non-display region outside the display region, and rear surfaces of the first and second flexible panels may be respectively coupled to the first and second cases.

The Each of the first and second cases may include a rounded portion at the adjacent boundary regions of the first and second flexible panels, and the curved regions of the first and second flexible panels may be respectively coupled to the rounded portions of the first and second cases.

The respective display and non-display regions may extend onto the curved regions of the first and second flexible panels. The display regions may be on a front side, which is a viewing direction, of the curved regions of the first and second flexible panels, and the non-display regions may be on a rear side of the curved regions of the first and second flexible panels with respect to a nearest point between the first and second flexible panels.

A bending angle of the display region of the curved region of one of the first and second flexible panels may be greater than about 90 degrees.

A total bending angle of the display region and the non-display region in the curved region of one of the first and second flexible panels may be less than about 180 degrees.

When viewed from the front side, the display regions of the curved regions of the first and second flexible panels may be visible and the non-display regions thereof may not be visible.

The non-display regions on the curved regions of the first and second flexible panels may include corrugated wrinkle patterns.

Adhesive films may be respectively arranged between the first flexible panel and the first case and between the second flexible panel and the second case.

The foldable display apparatus may further include a controller configured to drive the first and second flexible panels to display an image.

The controller may be further configured to drive the first and second flexible panels to together display a continuous image.

The controller may be further configured to drive the first and second flexible panels to display separate images.

The first and second cases may be configured to be folded such that the first and second flexible panels face each other.

The first and second cases may respectively include first and second combining grooves at which the first and second flexible panels are coupled to the first and second cases.

The first and second flexible panels may include organic light-emitting devices.

When the foldable display apparatus is unfolded, the adjacent boundary regions of the first and second flexible panels may be spaced from each other by a gap.

When the foldable display apparatus is unfolded, the first and second flexible panels may contact each other at the adjacent boundary regions.

Other aspects, features, and characteristics of exemplary embodiments, other than those described above, may be clear from the drawings, claims, and the detailed descriptions of exemplary embodiments.

BRIEF DESCRIPTION OF THE DRAWINGS

These and/or other aspects will become apparent and more readily appreciated from the following description of exemplary embodiments, taken in conjunction with the accompanying drawings, in which.

DETAILED DESCRIPTION

Figure 1:
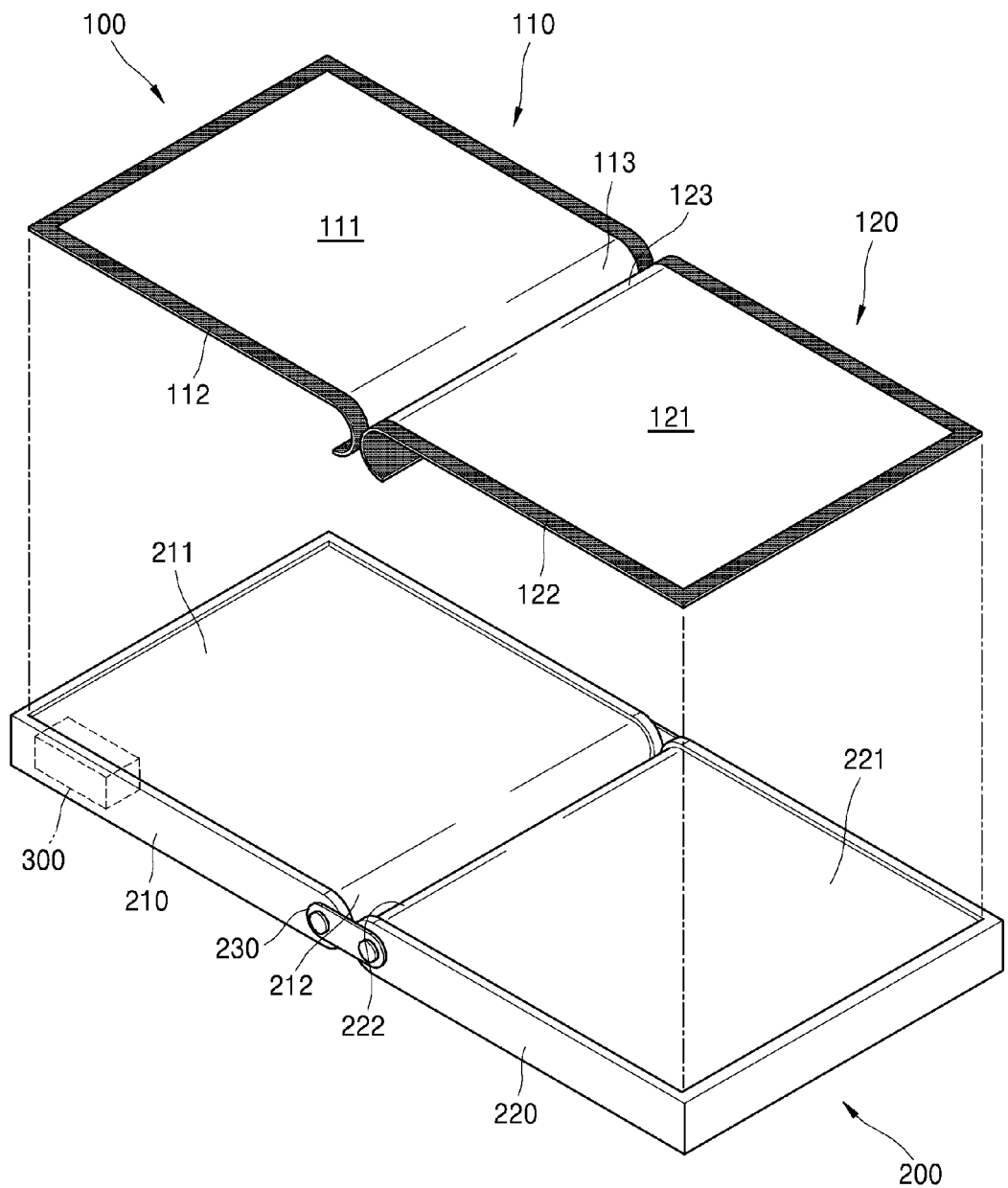
FIG. 1 is an exploded perspective view of a foldable display apparatus according to an exemplary embodiment.

The presented exemplary embodiments may be modified into various forms, and the present invention may have various embodiments. In this regard, the detailed description will now be made in detail to embodiments, examples of which are illustrated in the accompanying drawings. The aspects and features of the present invention may be clear when referring to the embodiments described below together with the drawings. However, the present invention may have different forms than the presented exemplary embodiments and should not be construed as being limited to the descriptions set forth herein.

Hereafter, the present invention will be described more fully with reference to the accompanying drawings, in which exemplary embodiments are shown. In describing the embodiments with reference to drawings, like reference numerals are used for elements that are substantially identical or correspond to each other, and the descriptions thereof may not be repeated. Further, sizes of elements in the drawings may be exaggerated for convenience of explanation, and because sizes and thicknesses of components in the drawings may be arbitrarily illustrated for convenience of explanation, the following embodiments are not limited thereto.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The controller and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the controller may be formed on one integrated circuit (IC) chip or on separate IC chips. Further, the various components of the controller may be implemented on a flexible printed circuit film, a tape carrier package (TCP), a printed circuit board (PCB), or formed on a same substrate as the controller. Further, the various components of the controller may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

When a certain embodiment may be implemented differently, a specific process order may be performed differently from the described order. For example, two consecutively described processes may be performed at substantially the same time (e.g., concurrently) or may be performed in an order opposite to the described order.

Figure 2:
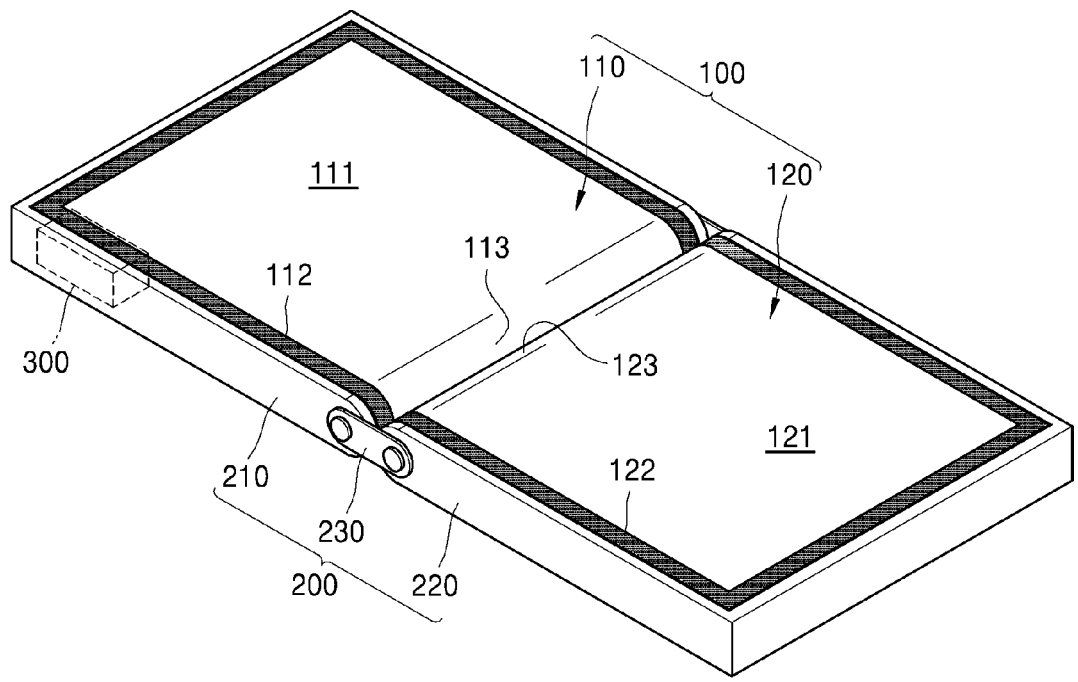
FIG. 2 is a perspective view of the foldable display apparatus of FIG. 1.

FIGS. 1 and 2 are respectively an exploded perspective view and a perspective view of a foldable display apparatus according to an exemplary embodiment.

Figure 3A:
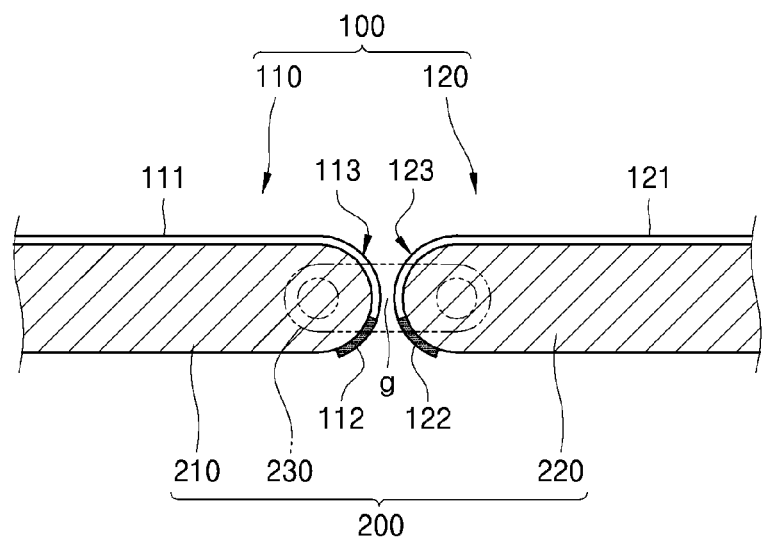
FIGS. 3A and 3B are cross-sectional views respectively illustrating an unfolded state and a folded state of the foldable display apparatus shown in FIG. 2.
Figure 3B:
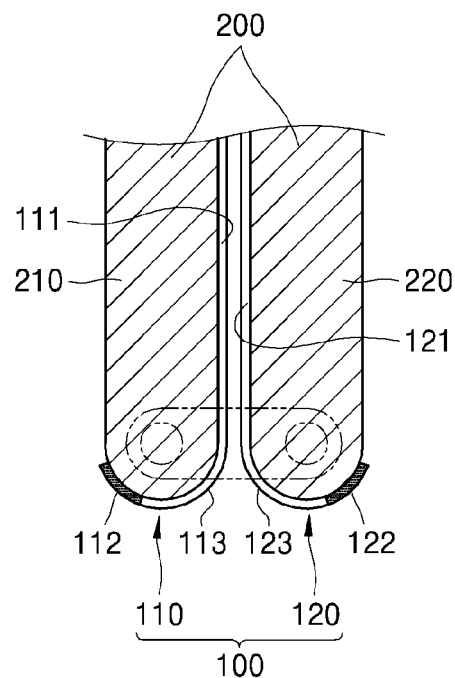

The foldable display apparatus includes a flexible display panel 100 as a flexibly bendable display unit. The flexible display panel 100 has a structure in which a thin film transistor and a light emitting-device for displaying an image and an encapsulating layer to protect the thin film transistor and the light-emitting device by covering them are stacked on a flexible substrate. The flexible substrate is used instead of, for example, a hard glass substrate, and thus, the flexible display panel 100 may be bent within a permissible range of flexibility. For example, an organic light-emitting display device, etc. may be the flexible display panel 100. In one embodiment, the flexible display panel 100 is not formed as a one unit (e.g., is not a single unit) but, as depicted in FIG. 1, may include a first flexible panel 110 and a second flexible panel 120 that are separate from each other. The two separate panels, that is, the first flexible panel 110 and the second flexible panel 120, together form a screen of the foldable display apparatus, and adjacent boundary regions of the first and second flexible panels 110 and 120 may be a folding unit (e.g., a folding portion or folding area) at which opening and folding operations are performed or occur. Accordingly, in a folded state, as depicted in FIG. 3B, the first flexible panel 110 and the second flexible panel 120 may be folded to face each other about the folding unit.

The first flexible panel 110 and the second flexible panel 120 are respectively supported by a first case 210 and a second case 220 of a folding case 200 to be folded and unfolded. For example, the first flexible panel 110 is combined with (e.g., attached to) a first combining groove 211 (e.g., a first depression) in the first case 210, and the second flexible panel 120 is combined with a second combining groove 221 (e.g., a second depression) in the second case 220. Hereinafter, surfaces of the first flexible panel 110 and the second flexible panel 120 that are respectively attached to the first and second combining grooves 211 and 221 may be referred to as rear surfaces, and surfaces opposite to the rear surfaces, that is, viewing sides or surfaces, are referred to as front surfaces.

The first and second cases 210 and 220 are connected to each other by a link member 230. For example, opposite ends of the link member 230 are rotatably combined with the first and second cases 210 and 220. Thus, as depicted in FIG. 3A, the folding case 200 has or can enter an unfolded state in which the first and second flexible panels 110 and 120 are unfolded, and as depicted in FIG. 3B, the folding case 200 has or can enter a folded state in which the first and second flexible panels 110 and 120 face each other.

Also, in the folding unit of the first and second cases 210 and 220, that is, in the boundary regions of the first and second cases 210 and 220 that are adjacent to each other, round units 212 and 222 (e.g., rounded edges) that are curved are provided (e.g., adjacent edges of the first and second cases 210 and 220 are rounded or curved). When the first and second flexible panels 110 and 120 are respectively combined with the first and second cases 210 and 220, portions thereof located on the round units 212 and 222 form curve units 113 and 123 (e.g., curved portions) by correspondingly bending along the curvature of the round units 212 and 222.

Also, the first and second flexible panels 110 and 120 respectively include display regions 111 and 121 on which an image is displayed and non-display regions 112 and 122 outside the display regions 111 and 121. Thin film transistors and organic light-emitting devices may be disposed at the display regions 111 and 121, and a wiring unit covered by a black matrix may be disposed at the non-display regions 112 and 122.

Figure 4:
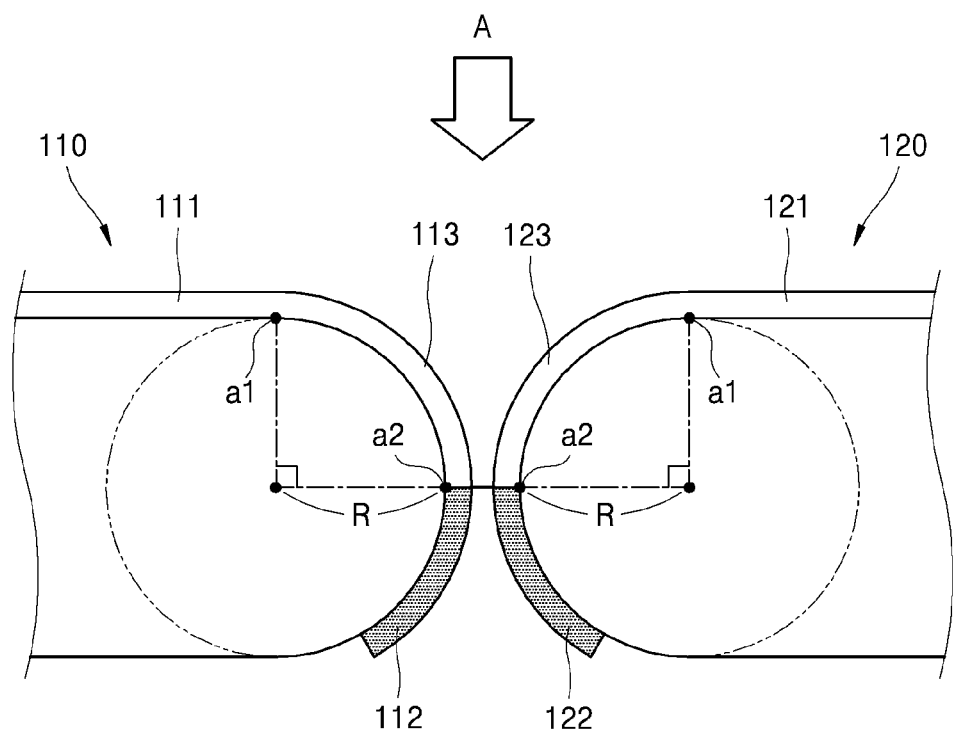
FIG. 4 is a magnified cross-sectional view of a folding unit of the foldable display apparatus shown in FIG. 2.

The curve units 113 and 123 may also include the display regions 111 and 121 and the non-display regions 112 and 122 (e.g., the display regions 111 and 121 and the non-display regions 112 and 122 may extend onto the curve units 113 and 123). As depicted in FIG. 4, when the front surfaces of the curve units 113 and 123 are viewed along a direction indicated by the arrow A, which is an image viewing direction, the display regions 111 and 121 are visible and the non-display regions 112 and 122 are not visible. For example, because the non-display regions 112 and 122 are visible as a discontinuous line or area on which an image is not displayed, if the non-display regions 112 and 122 are visible from the front side, the first and second flexible panels 110 and 120 will not appear to be connected or will appear disconnected to a viewer. The first and second flexible panels 110 and 120 may display an image on a connected screen (e.g., the first and second flexible panels 110 and 120 may together display a continuous image), and thus, if a discontinuous line or area is visible in the middle of the screen (e.g., between the first and second flexible panels 110 and 120), a viewer may feel that the image is cut away and is un-natural. Accordingly, as depicted in FIG. 4, when the curve units 113 and 123 are viewed from the front side (the direction indicated by the arrow A), the non-display regions 112 and 122 on the curve units 113 and 123 are not visible, even though the first and second flexible panels 110 and 120 are spaced or separated from each other, and the image may be viewed as a connected or continuous image.

To display the connected or continuous image, the display regions 111 and 121 may be disposed on the front side and the non-display regions 112 and 122 may be disposed on the rear side of the first and second round units 212 and 222 with respect to the point a2 in FIG. 4, which is an area of the first and second round units 212 and 222 at which the first and second flexible panels 110 and 120 are nearest to each other. For example, the curve units 113 and 123 may be viewed only up to the point a2, which is at which the first and second flexible panels 110 and 120 are nearest to each other, when viewed from the front side and may not be viewed beyond the point a2 (e.g., only portions of the curve units 113 and 123 up to the point a2 may be visible to a viewer and portions thereof at or past the point a2 may not be visible to a viewer). Thus, the display regions 111 and 121 extend at least to the point a2.

When the viewing regions are expressed as a viewing angle, a bending angle from a point a1, where the curve units 113 and 123 start (e.g., where the first and second flexible panels 110 and 120 begin to curve), to the point a2 may be greater than about 90 degrees. When the total bending angle, including the display regions 111 and 121 and the non-display regions 112 and 122, exceeds about 180 degrees, a dead space of the flexible panels 110 and 120 occupied by the non-display regions 112 and 122 may be relatively wide, and thus, the total bending angle may not exceed about 180 degrees.

The folding and unfolding operation will be further described below. However, first, an inner structure of the flexible display panel 100 will be briefly described.

Figure 5:
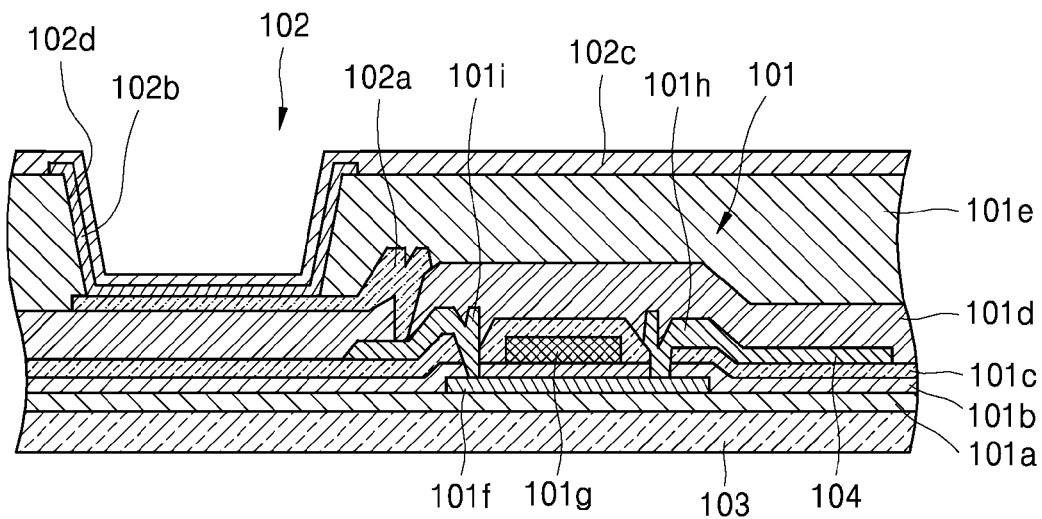
FIG. 5 is a cross-sectional view illustrating a structure of a display region of the foldable display apparatus shown in FIG. 2.

FIG. 5 is a cross-sectional view illustrating a structure of the display region 111 of the first flexible panel 110. The structure of the display region 121 of the second flexible panel 120 may be substantially the same or the same as that of the display region 111.

Referring to FIG. 5, the display region 111 includes a thin film transistor 101 and an organic light-emitting device 102. For example, an active layer 101*f* is formed on a buffer layer 101*a* that is adjacent to a flexible substrate 103, and the active layer 101*f* includes source and drain regions that are highly doped with an N-type dopant or a P-type dopant. The active layer 101*f* may be include an oxide semiconductor. The oxide semiconductor may include a metal element of Group 12, Group 13, and/or Group 14, such as, zinc, indium, gallium, tin, cadmium, germanium, or hafnium, or an oxide of a combination of two or more of these metals. For example, the active layer 101*f* may include $O[(In_2O_3)a(Ga_2O_3)b(ZnO)c]$ (where a, b, and c respectively are real numbers and a≥0, b≥0, and c>0). A gate electrode 101*g* is formed above the active layer 101*f* with a gate insulating film 101*b* therebetween. A source electrode 101*h* and a drain electrode 101*i* are formed above the gate electrode 101*g*. An interlayer insulating layer 101*c* is formed between the gate electrode 101*g* and the source and drain electrodes 101*h* and 101*i*, and a passivation film 101*d* is formed between the source and drain electrodes 101*h* and 101*i* and an anode electrode 102*a* of the organic light-emitting device 102.

An insulating planarizing film 101*e*, formed of an acryl, is formed above the anode electrode 102*a*. After forming an opening 102*d* in the insulating planarizing film 101*e*, the organic light-emitting device 102 is formed.

The organic light-emitting device 102 may emit red, green, and/or blue lights according to current flow and displays image information. The organic light-emitting device 102 includes the anode electrode 102*a* that receives a positive charge (e.g., positive power) from the drain electrode 101*i* by being connected to the drain electrode 101*i* of the thin film transistor 101, a cathode electrode 102*c* that is provided to cover the entire pixel and supplies a negative charge (e.g., negative power), and a light-emitting layer 102*b* disposed between the anode electrode 102*a* and the cathode electrode 102*c* to emit light.

A hole injection layer (HIL), a hole transport layer (HTL), an electron transport layer (ETL), and an electron injection layer (EIL) may be stacked adjacent to (e.g., above or below) the light-emitting layer 102*b*.

For reference, the light-emitting layer 102*b* may be separately formed in each pixel to form a unit pixel including pixels that emit red, green, and blue lights. In another embodiment, regardless of locations of the pixels, the light-emitting layer 102*b* may be commonly formed on all of the pixel regions. In this embodiment, the light-emitting layer 102*b* may be formed by vertically stacking or mixing layers that include light-emitting materials that emit, for example, red, green, and blue lights. While the light-emitting layer 102b emitting white light is described in one embodiment, the light-emitting layer 102b, in other embodiments, can emit a combination of other colors. Also, the light-emitting layer 102b may further include a color transformation layer that transforms the white light into a light having a color or may further include a color filter.

A thin film encapsulating layer, in which organic films and inorganic films are alternately stacked, may be formed on the cathode electrode 102c.

The flexible display panel 100 having the structure described above is flexible, and thus, as described above, the curve units 113 and 123 may be formed by bending the flexible panels 110 and 120 along the curvature of the round units 212 and 222 of the first and second cases 210 and 220.

Figure 6:
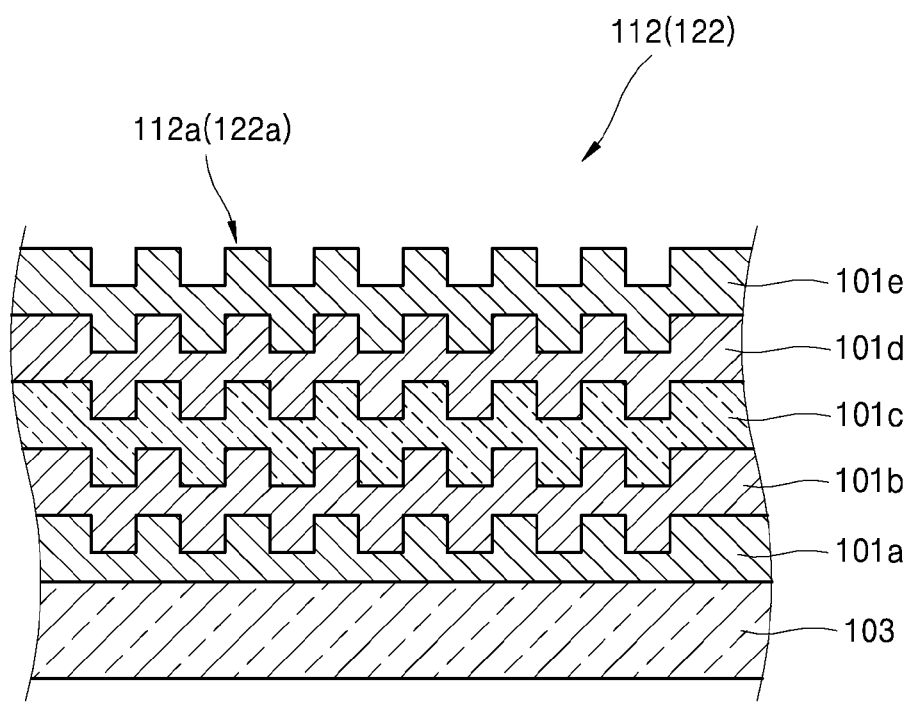
FIG. 6 is a cross-sectional view illustrating a structure of a non-display region of the foldable display apparatus shown in FIG. 2.

As depicted in FIG. 6, several insulating layers 101a, 101b, 101c, 101d, and 101e that extend from the display regions 111 and 121 into (e.g., through) the non-display regions 112 and 122 of the curve units 113 and 123 may be formed on the flexible substrate 103. When corrugated wrinkle patterns 112a and 122a are formed in the insulating layers 101a, 101b, 101c, 101d, and 101e as depicted in FIG. 6, a relatively inflexible layer, such as an inorganic film, may be smoothly bent.

The foldable display apparatus described above may be used as follows.

First, when the foldable display apparatus is in an unfolded state, in which the foldable display apparatus is flatly spread, as depicted in FIG. 3A, the first and second cases 210 and 220 are opened along a straight line.

Accordingly, a user may watch a plane image (e.g., a flat image) displayed by the first and second flexible panels 110 and 120 on the first and second cases 210 and 220 that are flatly opened. In this configuration, the non-display regions 112 and 122 at a boundary region located between the curve units 113 and 123 of the first and second flexible panels 110 and 120 are not visible from the viewing direction, and thus, a clean image in which a disconnection is not recognized (e.g., a continuous image) may be provided due to a single image being displayed by the closely arranged first and second flexible panels 110 and 120. In one embodiment, a controller 300 controls the first and second flexible panels 110 and 120 to be operated as a single screen. However, the controller 300 may control the first and second flexible panels 110 and 120 to be operated as separate screens.

For example, when the foldable display apparatus is stored or moved, the first and second cases 210 and 220 may be folded, as depicted in FIG. 3B. In this configuration, the first and second flexible panels 110 and 120 face each other and are safely protected on the inside of the first and second cases 210 and 220. Accordingly, the possibility of an external force damaging the first and second flexible panels 110 and 120 is relatively low.

When the foldable display apparatus is opened from the folded state to the unfolded state, as depicted in FIG. 3A, the first and second cases 210 and 220 are opened by rotating the first and second cases 210 and 220 with respect to the link member 230. In this configuration, a stable plane image may be displayed without a disconnection being visible (e.g., a single, continuous image may be displayed) although the two separate first and second flexible panels 110 and 120 are used to display the image.

The operation of folding and unfolding is performed by rotating the first and second cases 210 and 220 with respect to the link member 230 while the first and second flexible panels 110 and 120 are fixed on the first and second cases 210 and 220, respectively. Therefore, occurrences of exfoliation or deformation of the panels due to the folding and unfolding operation may be reduced or prevented.

Figure 7:
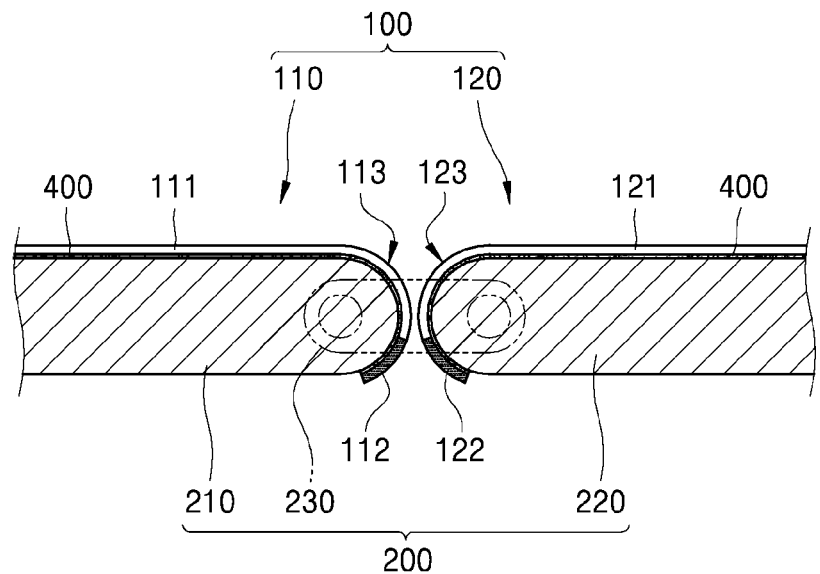
FIGS. 7 and 8 are cross-sectional views of modified embodiments of the foldable display apparatus shown in FIG. 2.

Rear surfaces of the first and second flexible panels 110 and 120 may be attached to the first and second cases 210 and 220 by an adhesive. For example, as depicted in FIG. 7, an additional adhesive film 400 may be formed therebetween.

Figure 8:
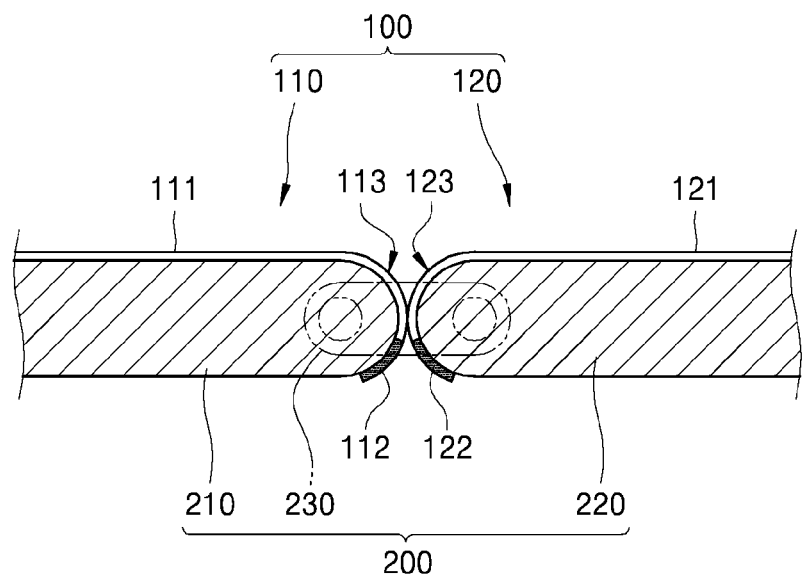

Also, a minute gap g, illustrated in FIG. 3A, is present between the first and second flexible panels 110 and 120 when the first and second flexible panels 110 and 120 are unfolded. However, as depicted in FIG. 8, the first and second flexible panels 110 and 120 may be configured to contact to each other without forming the gap g when they are unfolded. In this embodiment, a further stable plane image can be provided to a viewer without a disconnection being visible between the first and second flexible panels 110 and 120. However, when the first and second flexible panels 110 and 120 contact each other, pressure is repeatedly applied to the contact area, and thus, degradation of the flexible panels 110 and 120 at the contact portion may be accelerated. Therefore, the structure having a gap g or the structure without the gap g can be selected based on various design considerations.

Therefore, in the foldable display apparatuses described above, because separate first and second flexible panels, divided with respect to a folding unit, do not include a folding portion, damage, such as exfoliation or deformation of a protection film, may not occur. Also, non-display regions of the curve units of the flexible panels are not viewed from a front side, which is a viewing direction, when the first and second flexible panels are unfolded, and thus, a clean plane image may be displayed.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A foldable display apparatus comprising:
 a first flexible panel and a second flexible panel, the first and second flexible panels being separate from each other, each of the first and second flexible panels comprising a display region on which an image is displayed and a non-display region outside the display region;
 a first case supporting the first flexible panel and a second case supporting the second flexible panel; and
 a link member foldably connecting the first and second cases,
 wherein adjacent boundary regions of the first and second flexible panels are curved,
 wherein each of the first and second cases comprises a rounded portion at the adjacent boundary regions of the first and second flexible panels, the curved boundary regions of the first and second flexible panels being respectively coupled to the rounded portions of the first and second cases, and
 wherein the display regions are on a front side, which is a viewing direction, of the rounded portions of the first and second cases, and the non-display regions are on a rear side of the rounded portions of the first and second cases with respect to a nearest point between the first and second flexible panels, ends of the non-display regions on the rounded portions of the first and second cases being farther from each other than portions of the non-display regions on the rounded portions that are adjacent the display regions.

2. The foldable display apparatus of claim 1, wherein rear surfaces of the first and second flexible panels are respectively coupled to the first and second cases.

3. The foldable display apparatus of claim 1, wherein a bending angle of the display region of the curved region of one of the first and second flexible panels is greater than about 90 degrees.

4. The foldable display apparatus of claim 3, wherein a total bending angle of the display region and the non-display region in the curved region of one of the first and second flexible panels is less than about 180 degrees.

5. The foldable display apparatus of claim 1, wherein, when viewed from the front side, the display regions of the curved regions of the first and second flexible panels are visible and the non-display regions thereof are not visible.

6. The foldable display apparatus of claim 2, wherein the non-display regions on the curved regions of the first and second flexible panels comprise corrugated wrinkle patterns.

7. The foldable display apparatus of claim 1, wherein adhesive films are respectively arranged between the first flexible panel and the first case and between the second flexible panel and the second case.

8. The foldable display apparatus of claim 1, further comprising a controller configured to drive the first and second flexible panels to display an image.

9. The foldable display apparatus of claim 8, wherein the controller is further configured to drive the first and second flexible panels to together display a continuous image.

10. The foldable display apparatus of claim 8, wherein the controller is further configured to drive the first and second flexible panels to display separate images.

11. The foldable display apparatus of claim 1, wherein the first and second cases are configured to be folded such that the first and second flexible panels face each other.

12. The foldable display apparatus of claim 1, wherein the first and second cases respectively comprise first and second combining grooves at which the first and second flexible panels are coupled to the first and second cases.

13. The foldable display apparatus of claim 1, wherein the first and second flexible panels comprise organic light-emitting devices.

14. The foldable display apparatus of claim 1, wherein, when the foldable display apparatus is unfolded, the adjacent boundary regions of the first and second flexible panels are spaced from each other by a gap.

15. The foldable display apparatus of claim 1, wherein, when the foldable display apparatus is unfolded, the first and second flexible panels contact each other at the adjacent boundary regions.

* * * * *